(12) United States Patent
Al Kayal et al.

(10) Patent No.: US 10,461,735 B2
(45) Date of Patent: Oct. 29, 2019

(54) ELECTRICAL SWITCHING APPARATUS COMPRISING AN IMPROVED ELECTRICALLY INTERCONNECT DEVICE

(71) Applicant: ALSTOM Transport Technologies, Saint-Ouen (FR)

(72) Inventors: Fisal Al Kayal, Wemmel (BE); Christian Detongre, Chantelineau (BE)

(73) Assignee: ALSTOM Transport Technologies, Saint-Ouen (FR)

( * ) Notice: Subject to any disclaimer, the term of this patent is extended or adjusted under 35 U.S.C. 154(b) by 69 days.

(21) Appl. No.: 15/687,188

(22) Filed: Aug. 25, 2017

(65) Prior Publication Data
US 2018/0062637 A1  Mar. 1, 2018

(30) Foreign Application Priority Data
Aug. 26, 2016  (FR) ..................... 16 57958

(51) Int. Cl.
| | |
|---|---|
| *H03B 1/00* | (2006.01) |
| *H03K 3/00* | (2006.01) |
| *H03K 17/16* | (2006.01) |
| *H03L 7/00* | (2006.01) |
| *H03K 17/0412* | (2006.01) |

(52) U.S. Cl.
CPC ..... *H03K 17/161* (2013.01); *H03K 17/04123* (2013.01); *H03K 17/164* (2013.01); *H03L 7/00* (2013.01)

(58) Field of Classification Search
CPC .............. H03K 17/161; H03K 17/164; H03K 17/04123; H03L 7/00; H01L 23/485
USPC ........................................................ 327/109
See application file for complete search history.

(56) References Cited

U.S. PATENT DOCUMENTS

| | | | |
|---|---|---|---|
| 2009/0015992 A1 | 1/2009 | Nohara et al. | |
| 2013/0200929 A1* | 8/2013 | Sawada ................. | H02M 1/08 |
| | | | 327/109 |

FOREIGN PATENT DOCUMENTS

FR  2990312 A1  11/2013

OTHER PUBLICATIONS

French Search Report dated Apr. 18, 2017, issued in corresponding French Application FR1657958.

* cited by examiner

*Primary Examiner* — Metasebia T Retebo
(74) *Attorney, Agent, or Firm* — Troutman Sanders LLP

(57) ABSTRACT

This electrical switching apparatus has at least two power components each including first and second power transistors. A driver control device of the transistors is configured to deliver a first control signal to each of the first transistors and a second control signal to each of the second transistors, and an electrical interconnect device connecting the driver control device to the power components. The interconnect device includes several electrically conductive plates extending parallel to one another, each being connected between a control electrode of one of the first or second power transistors and a corresponding output of the driver control device.

10 Claims, 4 Drawing Sheets

ELECTRICAL SWITCHING APPARATUS COMPRISING AN IMPROVED ELECTRICALLY INTERCONNECT DEVICE

CROSS-REFERENCE TO RELATED APPLICATIONS

This application is based upon and claims the benefit of priority of the prior French Patent Application No. FR 1657958, filed on Aug. 26, 2016, the entire contents of which are incorporated herein by reference.

FIELD OF THE INVENTION

The invention relates to an electrical switching apparatus comprising an improved electrical interconnect device.

BACKGROUND

Electrical switching apparatuses exist in the field of power electronics, which include power transistors and a control device for driving these transistors suitable for delivering a control signal through one or several output interfaces. Such apparatuses are for example known including power transistors made from metal oxide semiconductor field effect technology, known by the acronym MOSFET, and made from silicon carbide. It is possible for these transistors to be grouped together in pairs within a power component, or unitary power pack.

In applications such as power converters, the various power transistors distributed in the power components must be controlled in a synchronized manner relative to one another. It is desirable for the driver control device to include a dedicated output interface, or "output voltage buffer", for each of the power transistors. The use of a dedicated output voltage buffer for each of these transistors makes it possible to obtain satisfactory control performance levels.

However, this solution has the drawback of being extremely expensive. Furthermore, it causes a significant bulk. The physical integration of a driver control device including several output voltage buffers is therefore extremely difficult, or even impossible for applications that require a miniaturized power converter with a smaller bulk.

To offset this drawback, it is known to use a single output voltage buffer that is shared by several power components commanded in parallel. The respective power transistors are thus connected in parallel with one another to the driver control device, via several cables or electrically conductive tracks. Such a solution is for example described in patent application FR 2,990,312 A1.

This known device is not, however, fully satisfactory. In order for the various transistors to be commanded in a synchronized manner relative to one another, it is mandatory for the cables or electrically conductive tracks to have a same length. The power transistors must therefore be placed equidistantly from the output voltage buffer. This complicates the arrangement of the various components of the electrical switching apparatus. This further requires moving the output voltage buffer far enough away from the various power components to leave enough space to arrange the cables or electrically conductive tracks, which results in increasing the stray electrical inductance due to the cabling. The presence of such a stray inductance may cause an uncontrolled oscillation of the control signal supplied by the driver control device and create malfunctions of the electrical switching apparatus, or even damage it irreversibly.

SUMMARY

The invention more particularly aims to resolve these drawbacks by proposing an electrical switching apparatus that has a controlled bulk and reasonable manufacturing cost, while allowing a reliable and satisfactory control of the driver of the power transistors.

To that end, the invention relates to an electrical switching apparatus, comprising:
- at least two power components, each including first and second power transistors,
- a driver control device of the transistors, configured to deliver a first control signal to each of the first transistors and a second control signal to each of the second transistors,
- an electrical interconnect device connecting the driver control device to the power components to transmit the first and second control signals to the first and second transistors, wherein the interconnect device comprises several electrically conductive plates extending parallel to one another, each of these electrically conductive plates being connected between a control electrode of one of the first or second power transistors and a corresponding output of the driver control device.

Owing to the invention, the electrically conductive plates of the interconnect device minimize the stray cabling inductance, while electrically connecting the power components to a same output interface of the driver control device compactly.

According to advantageous, but optional aspects of the invention, such an electrical switching apparatus may incorporate one or more of the following features, considered in any technically admissible combination:
- Each first power transistor comprises first and second control electrodes, each second power transistor comprises third and fourth control electrodes, and the electrical interconnect device comprises first, second, third and fourth electrically conductive plates electrically connecting the first, second, third and fourth control electrodes, respectively, to the respective outputs of the driver control device.
- The first and second electrically conductive plates are arranged on opposite sides of a first electrically insulating support and the third and fourth conductive plates are arranged on opposite sides of a second electrically insulating support.
- The first and second electrically conductive plates have an identical shape and are superimposed with one another.
- The third and fourth electrically conductive plates have an identical shape and are superimposed with one another.
- The electrically conductive plates are stacked with one another, the first and second electrically conductive plates being laterally offset relative to the third and fourth electrically conductive plates so as to be superimposed with these third and fourth electrically conductive plates only at an overlap zone.
- The overlap zone has a surface area smaller than or equal to less than 5%, preferably less than or equal to 2% of the surface area of one of the electrically conductive plates.
- Each of the electrically conductive plates has a surface area greater than or equal to 1 $cm^2$ and less than or equal to 10 $cm^2$.

The electrically conductive plates are made from metal, for example copper.

The first and second power transistors are metal oxide semiconductor field effect transistors or isolated gate bipolar transistors or bipolar transistors.

BRIEF DESCRIPTION OF THE DRAWINGS

The invention will be better understood, and other advantages thereof will appear more clearly, in light of the following description of one embodiment of an electrical switching apparatus provided solely as a non-limiting example and done in reference to the appended drawings, in which.

DETAILED DESCRIPTION

Figure 1:
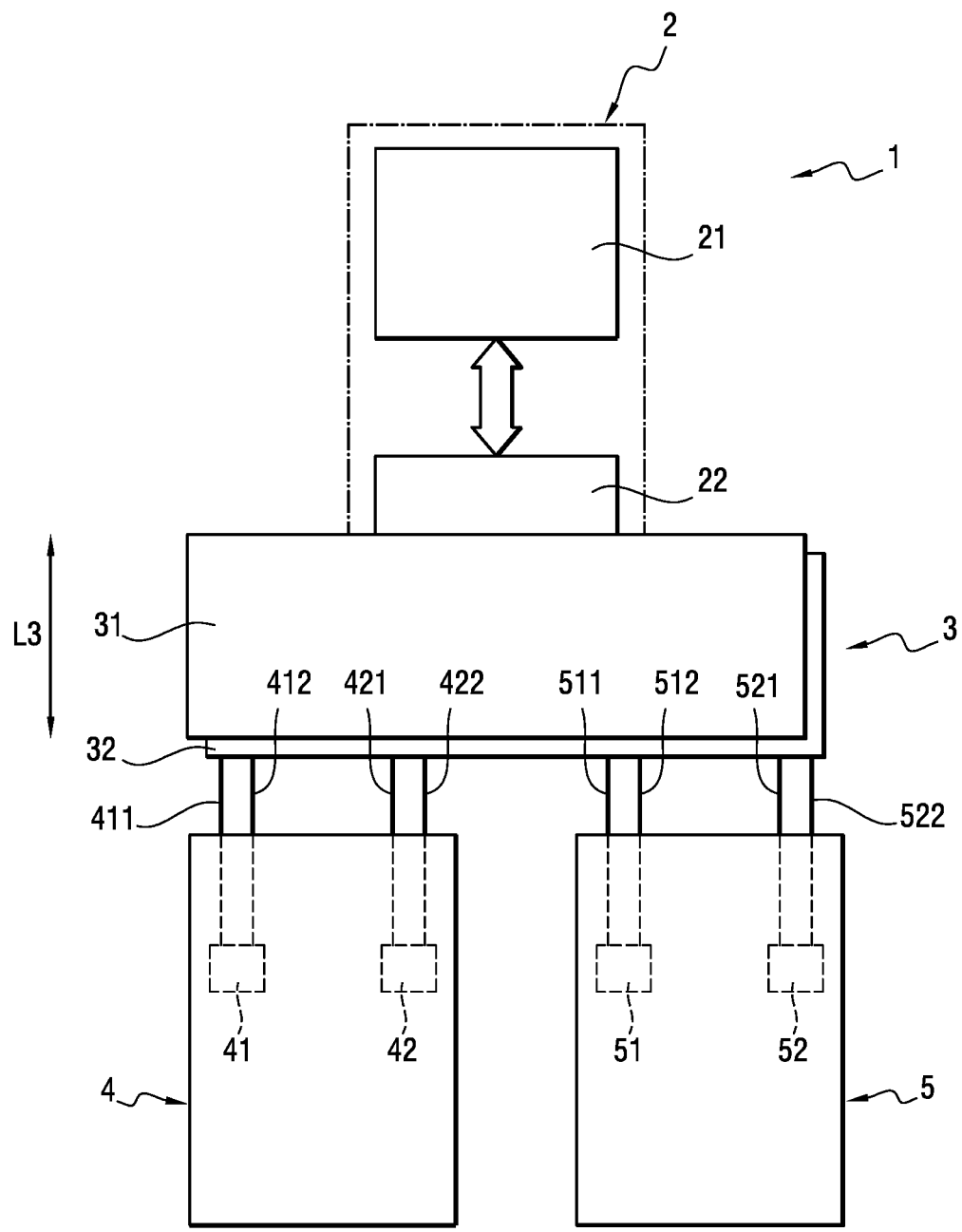
FIG. 1 is a schematic illustration of an electrical switching apparatus according to an example of the invention.
Figure 2:
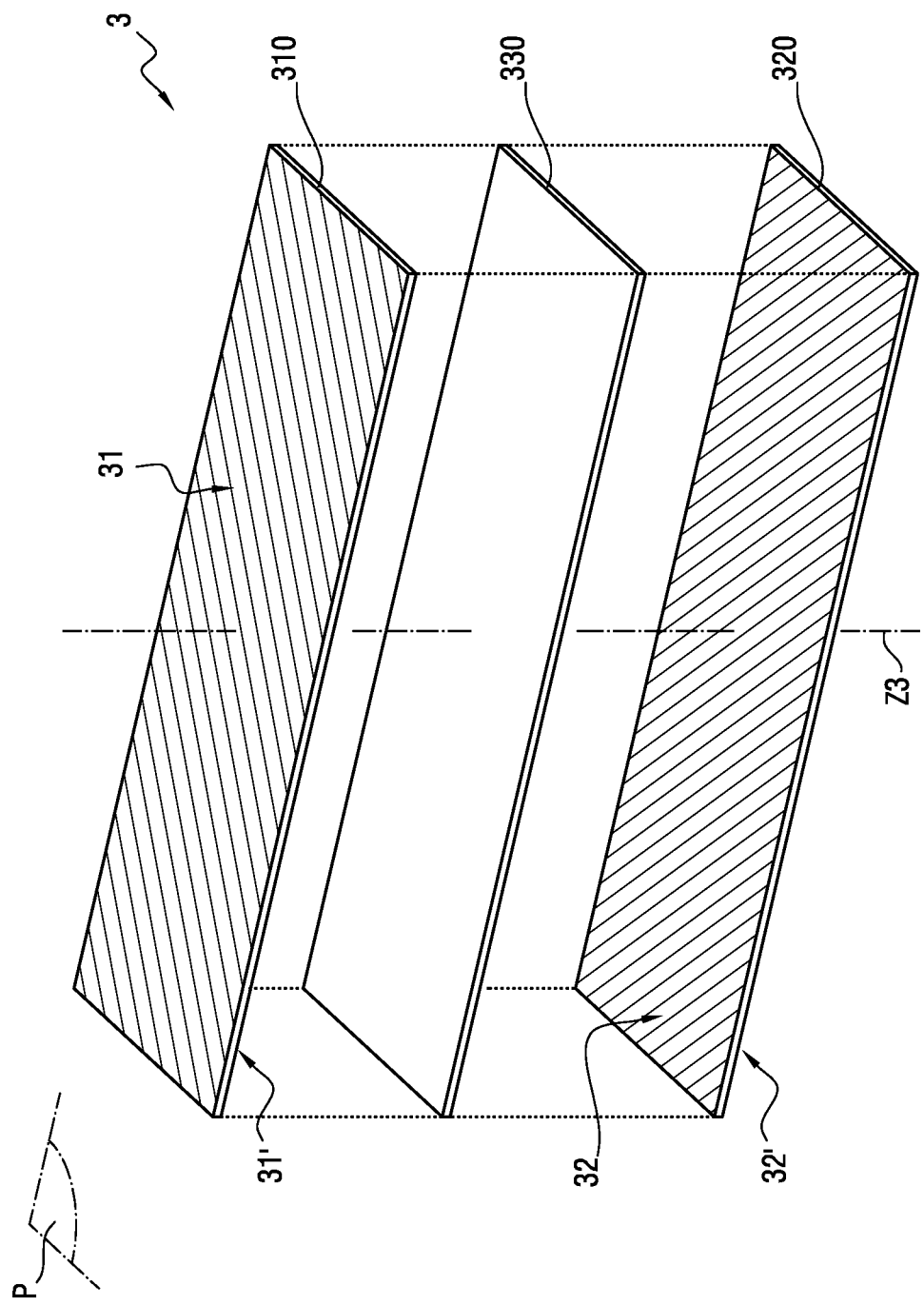
FIG. 2 is an exploded schematic illustration of an electrical interconnect device of the electrical switching apparatus of FIG. 1.

FIGS. 1 and 2 show an example of an electrical switching apparatus 1.

The apparatus 1 comprises a driver control device 2, an interconnect device 3 and at least two power components 4 and 5.

Each of the power components 4 and 5 includes first and second power transistors. In this example, the power transistors are transistors made from metal oxide semiconductor field effect technology, known by the acronym MOSFET. These power transistors here are made from silicon carbide.

Alternatively, the first and second power transistors are isolated gate bipolar transistors or bipolar transistors, or any other transistor using semiconductor technology.

References 41 and 42 respectively denote the first and second power transistors of the first power component 4. References 51 and 52 respectively denote the first and second transistors of the power component 5. In this example, the first transistors 41, 51 and the second transistors 42, 52 of each of the components 4, 5 are identical to one another.

The driver device 2, or igniter device, is configured to deliver a first control signal to each of the first transistors 41 and 51 and to deliver a second control signal to each of the second transistors 42 and 52, so as to control these transistors in parallel and in a synchronized manner.

The driver device 2 here comprises a driver control circuit 21 and an output voltage buffer 22 of a driver control signal. The output voltage buffer 22 is connected to the driver control circuit 21. The first and second control signals are generated by the control circuit 21 and are sent to the transistors 41, 42 and 51, 52 via the output interface 22.

Each of the transistors 41, 42, 51 and 52 is provided with control electrodes that make it possible to control the operation of the corresponding transistor, in particular to control the corresponding transistor between electrically on or off states, when this control electrode receives a control signal from the control device 2.

References 411 and 412 respectively denote the first electrodes of the transistor 41, 421 and 422 the first and second electrodes of the transistor 42, 511 and 512 the first and second electrodes of the transistor 51, and 521 and 522 the first and second electrodes of the transistor 52.

For example, in the case of a MOSFET transistor, the first electrodes 411, 421, 511 and 521 of each of the transistors 41, 42, 51 and 52 correspond to source electrodes of these transistors. The second electrodes 412, 422, 512 and 522 of each of the transistors 41, 42, 51 and 52 correspond to gate electrodes of these transistors.

Thus, the first and second control signals are respectively grid voltages of the first and second transistors 41, 42, 51 and 52. More specifically, the first control signal is a difference in electrical potential intended to be applied between the gate and source electrodes of each first transistor 41, 51. The second control signal is a difference in electrical potential intended to be applied between the gate and source electrodes of each second transistor 42, 52.

The interconnect device 3 electrically connects the output voltage buffer 22 to the power components 4 and 5, so as to transmit the first and second control signals to the first and second transistors 41, 42, 51 and 52, respectively.

This interconnect device 3 comprises one or several electrically conductive plates, denoted 31, 31', 32 and 32', which extend parallel to one another and which are each connected between a control electrode of one of the first or second power transistors on the one hand, and a corresponding output 22 of the driver control device 2 on the other hand.

FIG. 2 shows a more detailed example of the plates 31, 31', 32 and 32'.

The plates 31 and 31' see to the transmission of the first control signal from the output voltage buffer 22 to the transistors 41 and 51. Similarly, the plates 32 and 32' see to the transmission of the second control signal to the transistors 42 and 52.

The plates 31, 31', 32 and 32' are each planar and extend parallel to a geometric plane P perpendicular to a transverse axis Z3. The plates 31 and 31' are arranged on opposite sides of a first electrically insulating support 310 of the device 3. Likewise, the electrically conductive plates 32 and 32' are arranged on opposite sides of a second electrically insulating support 320 of the device 3. The plates 31, 31', 32 and 32' here all have the same shape and are superimposed with one another. They all have a regular quadrilateral shape, such as a rectangular rhomb. The plates 31, 31', 32 and 32' here each have a surface area greater than or equal to 1 cm$^2$ and less than or equal to 10 cm$^2$.

The plates 31, 31', 32 and 32' here are made from a metal, such as copper, deposited on opposite faces of the supports 310 and 320. For example, the supports 310 and 320 are epoxide resin plates, such as PCB (Printed Circuit Board).

Here, in a mounted configuration of the device 3, the supports 310 and 320 are superimposed such that the face of the support 310 bearing the plate 31' is turned toward the face of the support 320 that bears the plate 32.

Advantageously, the device 3 comprises a layer 330 of an electrically insulating material, interposed between the plates 31' and 32. In a mounted configuration of the device 3, the plates 32 and 31' are in contact with the layer of the insulating material 330.

In this example, the first plate 31 is electrically connected to the first electrodes 411 and 511. The second plate 31' is electrically connected to the second electrodes 412 and 512. The third plate 32 is electrically connected to the third electrodes 421 and 521. The fourth plate 32' is electrically connected to the fourth electrodes 422 and 522. These electrical connections are for example done using a connecting element, not illustrated, or by directly welding the corresponding electrodes of the transistor on each of the plates 31, 31', 32 and 32'.

Furthermore, each of the plates 31, 31', 32 and 32' is electrically connected to a corresponding output of the output voltage buffer 22. For example, the output voltage buffer 22 comprises four outputs each comprising a terminal brought to a specific electrical potential and intended to be electrically connected to one of the first, second, third or fourth electrodes 411, 412, 421, 422, 511, 512, 521, 522. The application of the first and second control signals thus amounts to applying the corresponding electrical potential on each of the electrodes 411, 412, 421, 422, 511, 512, 521, 522.

The device 3 thus makes it possible to connect the power components 4 and 5 to the output voltage buffer 22 with a reduced bulk and without needing to install specific cabling, the length of which would be complicated to optimize in order to minimize the stray cabling inductance.

In this example, the length L3 of the device 3, i.e., the distance between the output voltage buffer 22 and the electrodes 411, 412, 421, 422, 511, 512, 521 and 522, is less than or equal to 5 cm, preferably less than or equal to 1 cm.

Alternatively, the apparatus 1 comprises more than two power components. The device 3 is then adapted accordingly. For example, the apparatus 1 comprises a third power component, not illustrated, identical to the power component 4 or 5 and comprising first and second transistors identical to those of the power components 4 and 5. In this case, each of the plates 31, 31', 32, 32' is further connected to the corresponding electrode of one of the transistors of this power component in the same way as for the power components 4 and 5.

Figure 3:
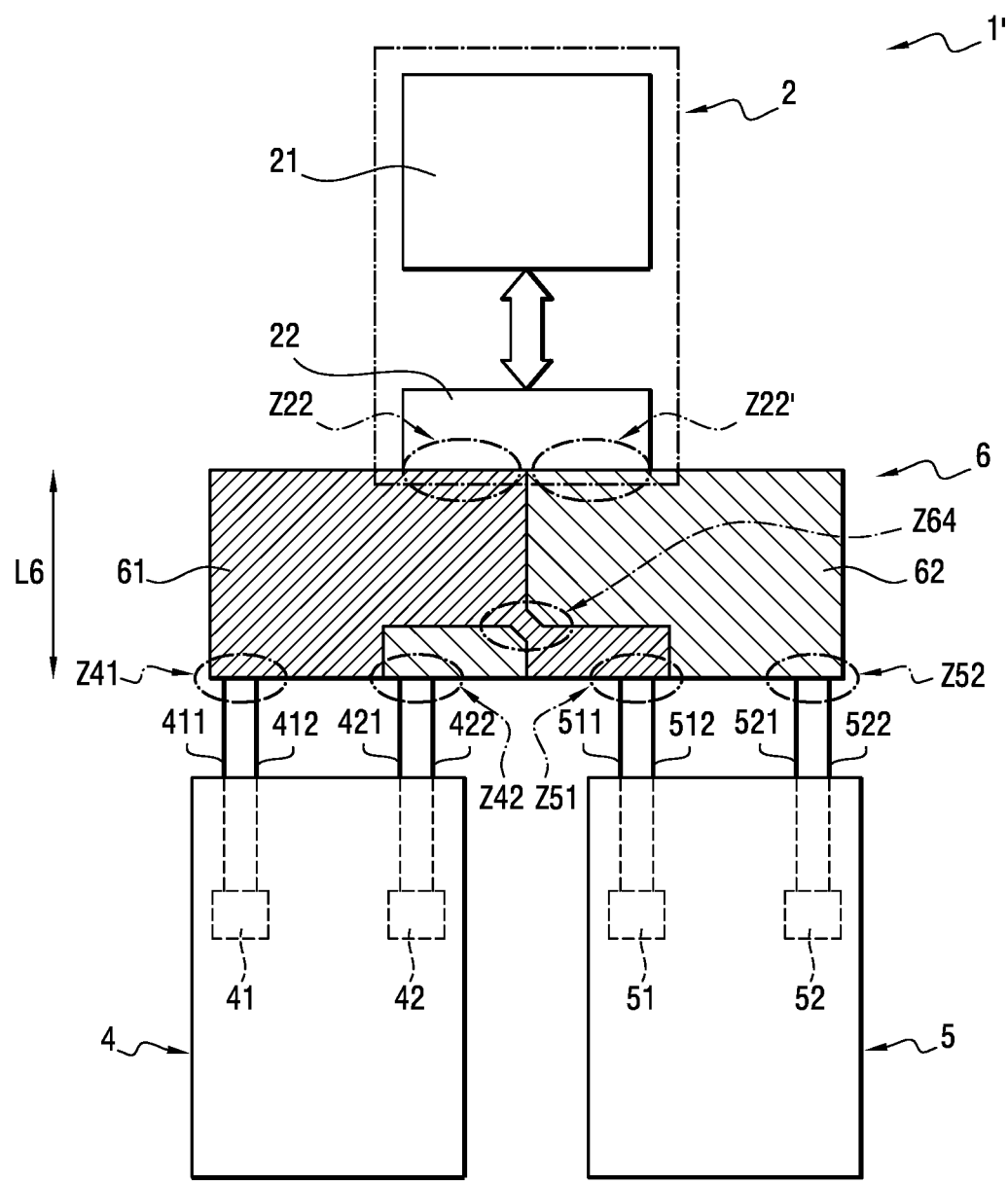
FIG. 3 is a schematic illustration of an electrical switching apparatus according to another example of the invention.
Figure 4:
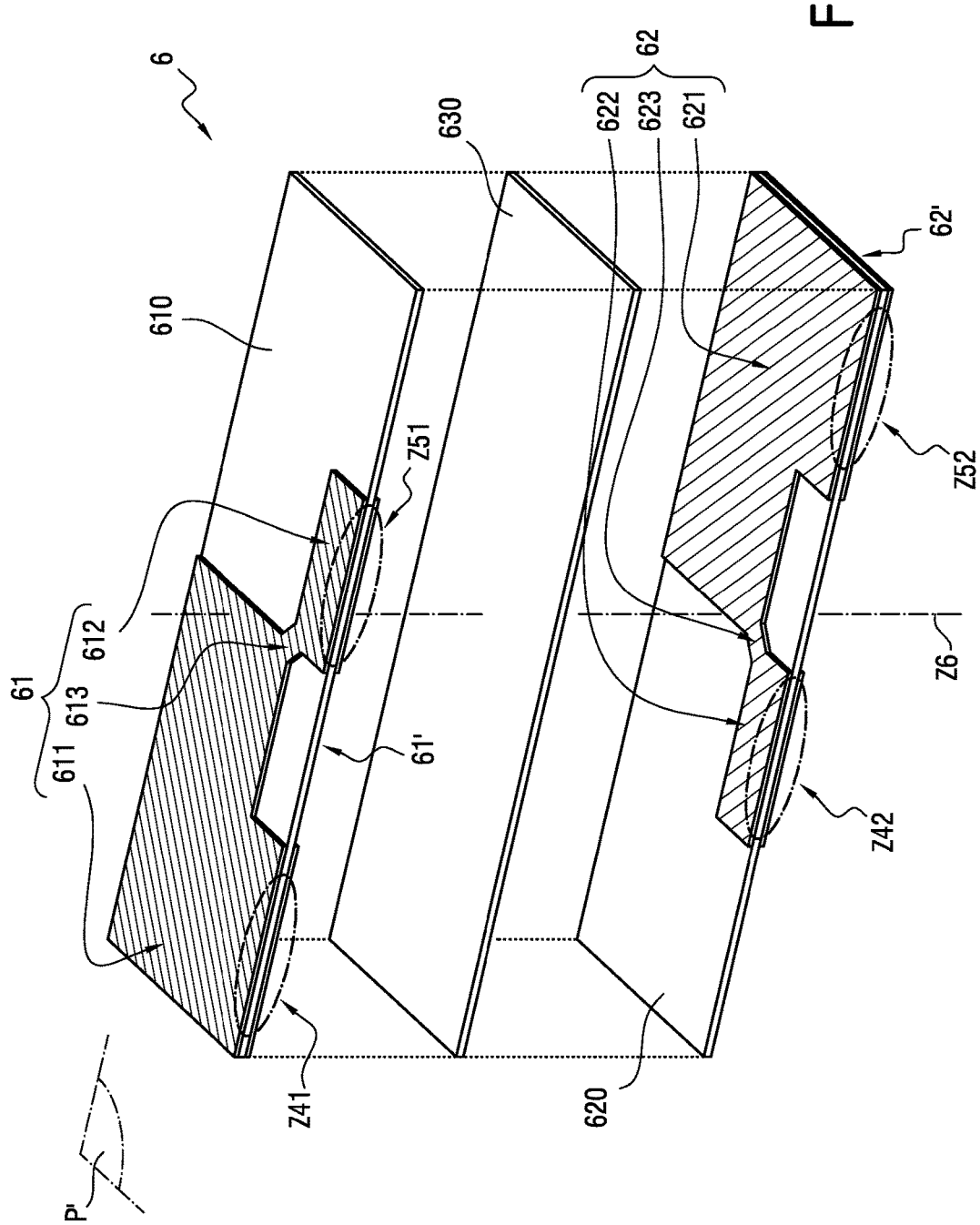
FIG. 4 is an exploded schematic illustration of an electrical interconnect device of the electrical switching apparatus of FIG. 3.

FIGS. 3 and 4 show another example of the invention. The elements of the switching apparatus according to this example that are similar to those of the above example bear the same references and are not described in detail, inasmuch as the above description can be transposed to them.

More specifically, FIGS. 3 and 4 show an electrical switching apparatus 1'. This apparatus 1' comprises an interconnect device 6 that replaces and plays a role similar to that of the interconnect device 3 of the apparatus 1 previously described.

The device 6 comprises four electrically conductive plates, denoted 61, 61', 62 and 62', extending parallel to one another and each connecting one of the first and second power transistors on the one hand and a corresponding output of the voltage output buffer 22 of the driver control device 2 on the other hand. The plates 61, 61', 62 and 62' extend parallel to a geometric plane P perpendicular to a transverse axis Z6 of the device 6.

The plates 61 and 61' see to the transmission of the first control signal from the output voltage buffer 22 to the transistors 41 and 51. Similarly, the plates 62 and 62' see to the transmission of the second control signal to the transistors 42 and 52. In this example, the first plate 61 is electrically connected to the first electrodes 411 and 511. The second plate 61' is electrically connected to the second electrodes 412 and 512. The third plate 52 is electrically connected to the third electrodes 421 and 521. The fourth plate 62' is electrically connected to the fourth electrodes 422 and 522. These electrical connections are for example done using a connecting element, not illustrated, or by directly welding the corresponding electrodes of the transistor on each of the plates 61, 61', 62 and 62'.

The plates 61 and 61' are arranged on opposite faces of an electrically insulating support 610 of the device 6. Similarly, the plates 62 and 62' are arranged on opposite faces of an electrically insulating support 620 of the device 6. The supports 610 and 620 are for example similar to the supports 310 and 320.

Each of the plates 61, 61', 62 and 62' here is formed from a metal, such as copper, deposited on the corresponding faces of the supports 610 and 620.

The plates 61 and 61' here have an identical shape. More specifically, the surface occupied by the plate 61' corresponds to a transpose along the direction of axis Z6 of the surface occupied by the plate 61. Similarly, the plates 62, 62' have a same shape and the surface occupied by the plate 62' corresponds to a transpose of the surface occupied by the plate 62 along the direction of axis Z6.

The first and second plates 61 and 61' are laterally offset relative to the third and fourth plates 62 and 62', i.e., offset along a direction belonging to the geometric plane P'. Advantageously, the device 6 comprises a layer 330 of an electrically insulating material 630, which plays the same role as the layer 330 previously described.

Each of the plates 61 and 61' has overlap with the plates 62 and 62' that is as small as possible. To that end, the plates 61 and 61' are superimposed with the plates 62 and 62' only at an overlap zone Z64. For example, the orthogonal projection, in the geometric plane P', of the surfaces occupied by the layers 61 and 61' is essentially separate from the orthogonal projection, in this same geometric plane P', of the surface areas occupied by the plates 62 and 62'. Essentially separate means that the surface area of the overlap zone Z64 is smaller than or equal to 5% of the surface area of the surface projected in the plane P' of the plates 61, 61', preferably less than or equal to 2% of this surface area. As an illustration, this surface area of the overlap zone Z64 is equal to 5 mm$^2$.

In this example, the plate 61 comprises a polygonal main part, a secondary part in the shape of a quadrilateral, and a connecting part 613 that connects the secondary part 612 to the main part 611. The main part 611 extends over part of the upper face of the support 610, between an interface zone Z22 with a corresponding output of the output voltage buffer 22 on the one hand, and an interface zone Z41 with the first transistor 41 on the other hand. The part 612 is adjacent to the part 611 and is placed across from an interface zone Z51 with the first transistor 51. The portion 613 connects the part 612 to the part 611.

The plate 62 has a similar structure and includes parts 621, 622 and 623. The part 621 extends over part of the upper face of the support 620, between an interface zone Z22 with a corresponding output of the output voltage buffer 22 on the one hand, and an interface zone Z52 with the second transistor 52 on the other hand. The part 622 is placed on an edge of the support 620 across from an interface zone Z42 with the second transistor.

The interface zone of a transistor refers to the portion of the device 6 that is placed across from the electrodes of this transistor when the device 6 is in a mounted configuration. For example, the interface zone Z41 corresponds to the portion of the device 6 that is placed across from the electrodes 411 and 412. The same is true for the zones Z22 and Z22' across from the output interface 22.

In a mounted configuration of the device 6, the plates 61 and 62' are in contact with the layer 630.

Owing to the device 6, the performance of the switching apparatus is improved, in particular relative to the interconnect device 3. By minimizing the overlap between the plates 61, 61' on the one hand and the plates 62, 62' on the other hand, the stray cabling inductances are reduced that may occur between these respective plates and that could create interference between the first and second control signals, which would deteriorate the operation of the electrical switching apparatus 1.

Furthermore, the particular arrangement of the plates 61, 61', 62 and 62' makes it possible to obtain a device 6 as compact as the device 3. In particular, the distance L6 of the device 6 between the output voltage buffer 22 and the components 4 and 5 is less than 5 cm, preferably less than 1 cm. The distance L6 here is defined similarly to the distance L3 previously described.

As previously described in reference to the apparatus 1, the apparatus 1' may comprise more than two power components, the power transistors of which are connected to the output voltage buffer 22 by the device 6.

The examples and alternatives considered above may be combined with one another to generate new examples of the invention.

The invention claimed is:

1. An electrical switching apparatus, comprising:
    at least two power components, each including first and second power transistors, wherein each first power transistor includes first and second control electrodes, and each second power transistor includes third and fourth control electrodes,
    a driver control device of the transistors, configured to deliver a first control signal to each of the first power transistors and a second control signal to each of the second power transistors,
    an electrical interconnect device connecting the driver control device to the power components to transmit the first and second control signals to the first and second power transistors,
        wherein the electrical interconnect device comprises first, second, third and fourth electrically conductive plates extending parallel to one another, each of these electrically conductive plates electrically connecting the first, second, third and fourth control electrodes, respectively, to the respective outputs of the driver control device, and
        wherein the first and second electrically conductive plates are arranged on opposite sides of a first electrically insulating support and in that the third and fourth electrically conductive plates are arranged on opposite sides of a second electrically insulating support.

2. The apparatus according to claim 1, wherein the first and second electrically conductive plates have an identical shape and are superimposed with one another.

3. The apparatus according to claim 1, wherein the third and fourth electrically conductive plates have an identical shape and are superimposed with one another.

4. The apparatus according to claim 1, wherein the electrically conductive plates are stacked with one another, the first and second electrically conductive plates being laterally offset relative to the third and fourth electrically conductive plates so as to be superimposed with these third and fourth electrically conductive plates only at an overlap zone.

5. The apparatus according to claim 4, wherein the overlap zone has a surface area smaller than or equal to less than 5% of the surface area of one of the electrically conductive plates.

6. The apparatus according to claim 5, wherein the overlap zone has a surface area smaller than or equal to 2% of the surface area of one of the electrically conductive plates.

7. The apparatus according to claim 1, wherein each of the electrically conductive plates has a surface area greater than or equal to 1 cm$^2$ and less than or equal to 10 cm$^2$.

8. The apparatus according to claim 1, wherein the electrically conductive plates are made from metal.

9. The apparatus according to claim 8, wherein the metal is copper.

10. The apparatus according to claim 1, wherein the first and second power transistors are metal oxide semiconductor field effect transistors or isolated gate bipolar transistors or bipolar transistors.

* * * * *